(12) United States Patent
Toyosawa

(10) Patent No.: US 6,552,419 B2
(45) Date of Patent: Apr. 22, 2003

(54) SEMICONDUCTOR DEVICE AND LIQUID CRYSTAL MODULE USING THE SAME

(75) Inventor: Kenji Toyosawa, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/022,498

(22) Filed: Dec. 20, 2001

(65) Prior Publication Data
US 2002/0096781 A1 Jul. 25, 2002

(30) Foreign Application Priority Data
Jan. 25, 2001 (JP) ........................................ 2001-017091

(51) Int. Cl.[7] .............................................. H01L 23/48
(52) U.S. Cl. ........................ 257/668; 257/723; 257/777
(58) Field of Search ................................ 361/813, 730, 361/735; 257/668, 723, 777

(56) References Cited

U.S. PATENT DOCUMENTS

| | | | |
|---|---|---|---|
| 4,763,188 A | * 8/1988 | Johnson | 357/74 |
| 5,471,369 A | * 11/1995 | Honda et al. | 361/813 |
| 5,646,829 A | * 7/1997 | Sota | 361/813 |
| 5,724,233 A | * 3/1998 | Honda et al. | 361/813 |
| 5,917,242 A | * 6/1999 | Ball | 257/737 |
| 5,998,860 A | * 12/1999 | Chan et al. | 257/679 |
| 6,093,970 A | * 7/2000 | Ohsawa et al. | 257/777 |
| 6,297,547 B1 | * 10/2001 | Akram | 257/676 |
| 6,313,528 B1 | * 11/2001 | Solberg | 257/723 |
| 6,396,116 B1 | * 5/2002 | Kelly et al. | 257/432 |

FOREIGN PATENT DOCUMENTS

JP 11-054695 2/1999

* cited by examiner

Primary Examiner—Kamand Cuneo
Assistant Examiner—Lourdes Cruz
(74) Attorney, Agent, or Firm—Birch, Stewart, Kolasch & Birch, LLP

(57) ABSTRACT

A semiconductor device using TCP structure, includes a first semiconductor chip mounted on a tape carrier by ILB and a second semiconductor chip mounted on the tape carrier by stacking onto the first semiconductor chip. The first semiconductor chip is arranged so that a first electrode, formed on a surface of the first semiconductor chip, is connected to an inner lead via a first gold bump. The second semiconductor chip is arranged so that a third electrode formed on the second semiconductor chip is connected to a second electrode formed on the same surface as the first electrode via a second gold bump. In this fashion, it is possible to reduce a terminal pitch of the semiconductor device on which more than one semiconductor chip are mounted.

13 Claims, 12 Drawing Sheets

SEMICONDUCTOR DEVICE AND LIQUID CRYSTAL MODULE USING THE SAME

FIELD OF THE INVENTION

The present invention relates to package structure of a semiconductor device using a tape to mount a semiconductor chip, and a liquid crystal module using the semiconductor device.

BACKGROUND OF THE INVENTION

TAB (Tape Automated Bonding), which is a technique to mount a semiconductor chip on a tape made of an organic base material, is used for a liquid crystal display unit employed as a monitor of a personal computer, mobile devices such as a mobile phone and a pocket game machine, and so forth. These devices are mounted using package structures such as a TCP (Tape Carrier Package) and a COF (Chip on Film). The TCP structure is preferable to use in package devices that are of thin designs, and such structures have been widely used in the aforementioned devices.

FIG. 12 is a cross-sectional view describing a typical mounting method using the TCP structure, which has been conventionally known. A tape (tape carrier) 3 is formed by creating a copper wiring pattern 2 on a base 1 made of organic materials such as polyimide. Extending parts 2a and 2b of the copper wiring pattern 2 extend from the periphery of the base 1 so as to be in parallel with each other. The extending part 2a is connected to, for instance, a pad of a liquid crystal panel, whereas the extending part 2b is connected to, for instance, a power source and a pad of a printed board to which an image data signal is transmitted. The parts are electrically connected via an anisotropic conductive film, for example.

A device hole 5 is formed in the base 1 corresponding to a semiconductor chip 4 to be mounted. The copper wiring pattern 2 juts into the device hole 5 to form inner leads 2c. The inner lead 2c and the extending parts 2a and 2b of the copper wiring pattern 2 are plated with tin (not illustrated). So as to be connected with the gold bumps 6 provided in all four sides of the rectangle semiconductor chip 4, the inner leads 2c juts into the device hole 5 from the four directions.

In the semiconductor chip 4 manufactured by dicing a wafer, i.e., eutectic, the gold bump 6 thereof is bonded with the tin which electroless-plates the inner lead 2c, and this arrangement is termed ILB (Inner Lead Bonding).

An element surface of the mounted semiconductor chip 4 and surroundings of the inner lead 2c are sealed by potting a resin 7, so that mechanical strength of the device is retained and the same is protected from the environment. Incidentally, other parts of the tape 3 other than the electrode parts, such as the inner lead 2c, are protected with a coating having a solder resist 8. The processes noted above are successively done on the tape 3 so that the mounting operation is efficiently done.

In the meantime, rapid development of electronic devices in recent years has demanded an arrangement of multiple chips instead of one chip being mounted on one tape. As an example of this, a liquid crystal module, mounted on small devices such as the aforementioned mobile phone and pocket game machine, will be described.

To keep up with an increase in the number of wires in the liquid crystal panel, the liquid crystal module has been arranged so that a memory is provided in a driver IC to boost efficiency of driver operation. However, as a result, memory capacity has been increased due to further growth of the number of pixel and employment of a color display. For instance, an SRAM occupies 60% of the surface of a semiconductor chip when the SRAM is manufactured along with common and segment drivers in a process necessary to manufacture the common and segment drivers.

Meanwhile, a driver part is required to withstand high voltage in order to control pixel contrast of a liquid crystal panel and hence a fine process is unsuitable for manufacturing the driver part. However, the fine process can be applied to manufacturing of a memory part since the same does not necessarily withstand high voltage. That is, although inapplicable to the driver part, the fine process can be applied to a memory part since the same is not under the constraint of voltage, and thus the liquid crystal module can meet the required level of integration in accordance with the number of wires of the liquid crystal panel.

Accordingly, it has been researched to form the driver part and the memory part separately in each optimized process, and then mount the manufactured two semiconductor chips, i.e. a driver chip and a SRAM chip, on one tape.

As a conventional technique to mount two semiconductor chips, for instance, Japanese Laid-Open Patent Publication No. 11-54695/1999 (Tokukaihei 11-54695; published on Feb. 26, 1999) discloses an arrangement as below.

In this arrangement, although not using the ILB process, a second semiconductor chip is stacked on a first semiconductor chip bonded on a lead frame. When stacked, the second semiconductor chip is provided with its face down and a melting point of a solder ball of the upper second semiconductor chip is arranged to be higher than that of a solder ball of the lower first semiconductor chip, so as to prevent the solder ball from dropping when soldering. On this account, the stacking can be fulfilled without using wire-bonding and the height of the package can be held low. Also, the Publication 11-54695/1999 discloses an arrangement wherein the lead frame is omitted by forming the second semiconductor chip to be smaller than the first chip and supporting the unoverlapped part with a supporting lead, so as to lower the chip by the same height.

However, it should be pointed out that the conventional technique as noted above cannot reduce a terminal pitch smaller than 100 μm due to the use of the solder joint, and hence the arrangement cannot meet the requirement to produce a finer liquid crystal panel.

SUMMARY OF THE INVENTION

The present invention aims at providing a semiconductor device in which a terminal pitch can be shortened and a liquid crystal module using the same, wherein the semiconductor device is arranged so that multiple numbers of chips are stacked.

To achieve the aim above, the semiconductor device of the present invention includes:

a tape carrier including: a wiring pattern formed on an organic base having an opening portion; and the wiring portion including an inner lead portion jutting into the opening portion;

a semiconductor chip mounted in the opening portion of the tape carrier and a first electrode formed on a surface of the semiconductor chip, the first electrode connected to the inner lead via a first gold bump; and an electronic component, mounted on the tape carrier by stacking onto the semiconductor chip, and the semiconductor chip including a second electrode formed on the same surface as the first electrode, the second electrode connected via a second gold bump to a third electrode formed on a first surface of the electronic component.

According to this arrangement, the semiconductor chip and the inner lead and also the semiconductor chip and the electronic component are connected via the gold bumps, when the semiconductor device using TCP structure is arranged so that multiple numbers of chips are stacked, namely the semiconductor chip is mounted by ILB and another electronic component is further mounted thereon.

In this manner, the gold bump is less deformed when connected to the electrodes than soft solder bumps which is softer than the gold bump. Furthermore, the terminal pitch can be shortened to, for instance, around 45 μm so that not less than 450 terminals can be provided on a chip which is around 20 mm long. As a result, the arrangement can meet the requirement to produce a finer liquid crystal panel.

For a fuller understanding of the nature and advantages of the invention, reference should be made to the ensuing detailed description taken in conjunction with the accompanying drawings.

DESCRIPTION OF THE EMBODIMENTS

The following description will describe a first embodiment in accordance with the present invention in reference to FIGS. 1 to 7.

Figure 1:
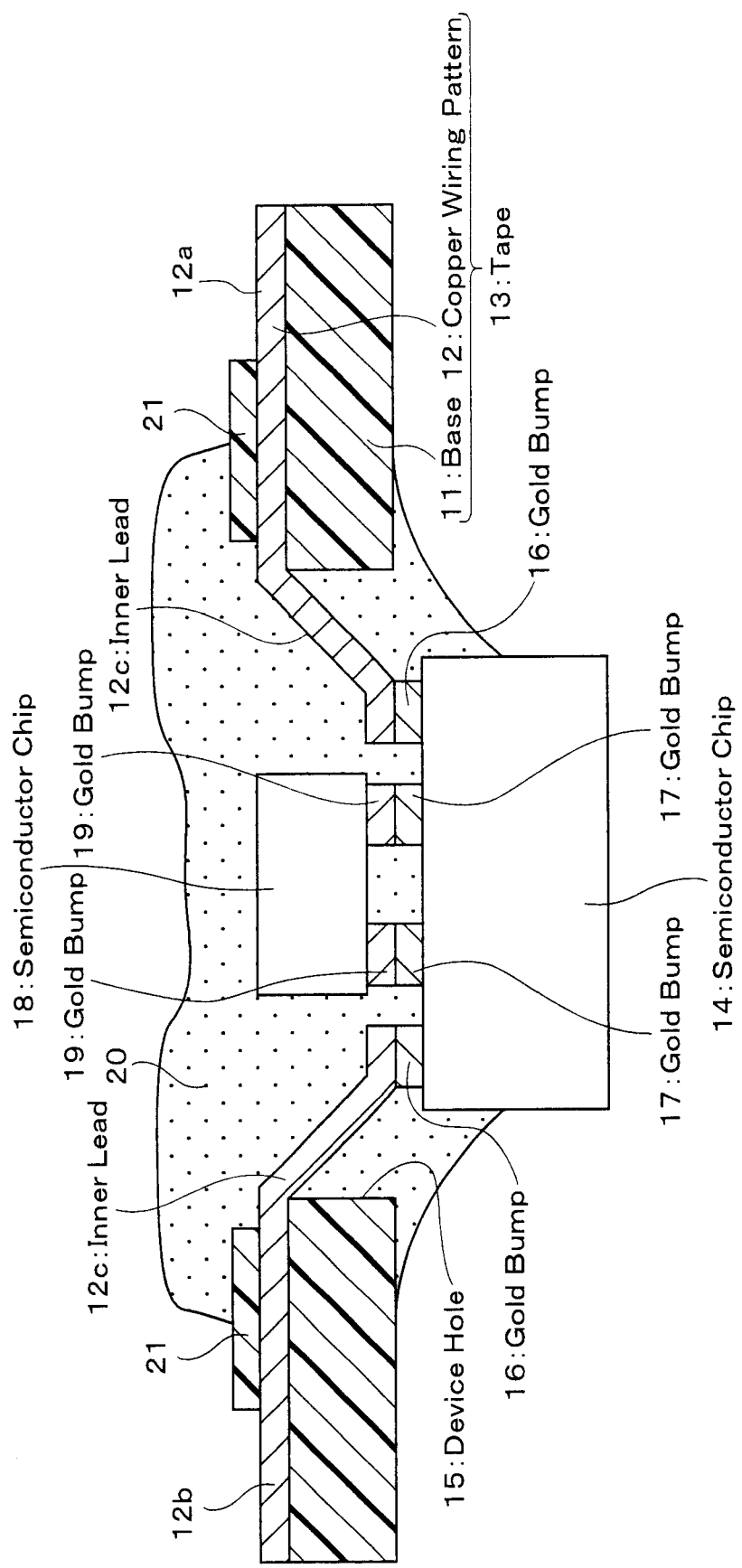
FIG. 1 is a cross-sectional view of a semiconductor device in accordance with a first embodiment of the present invention.
Figure 2:
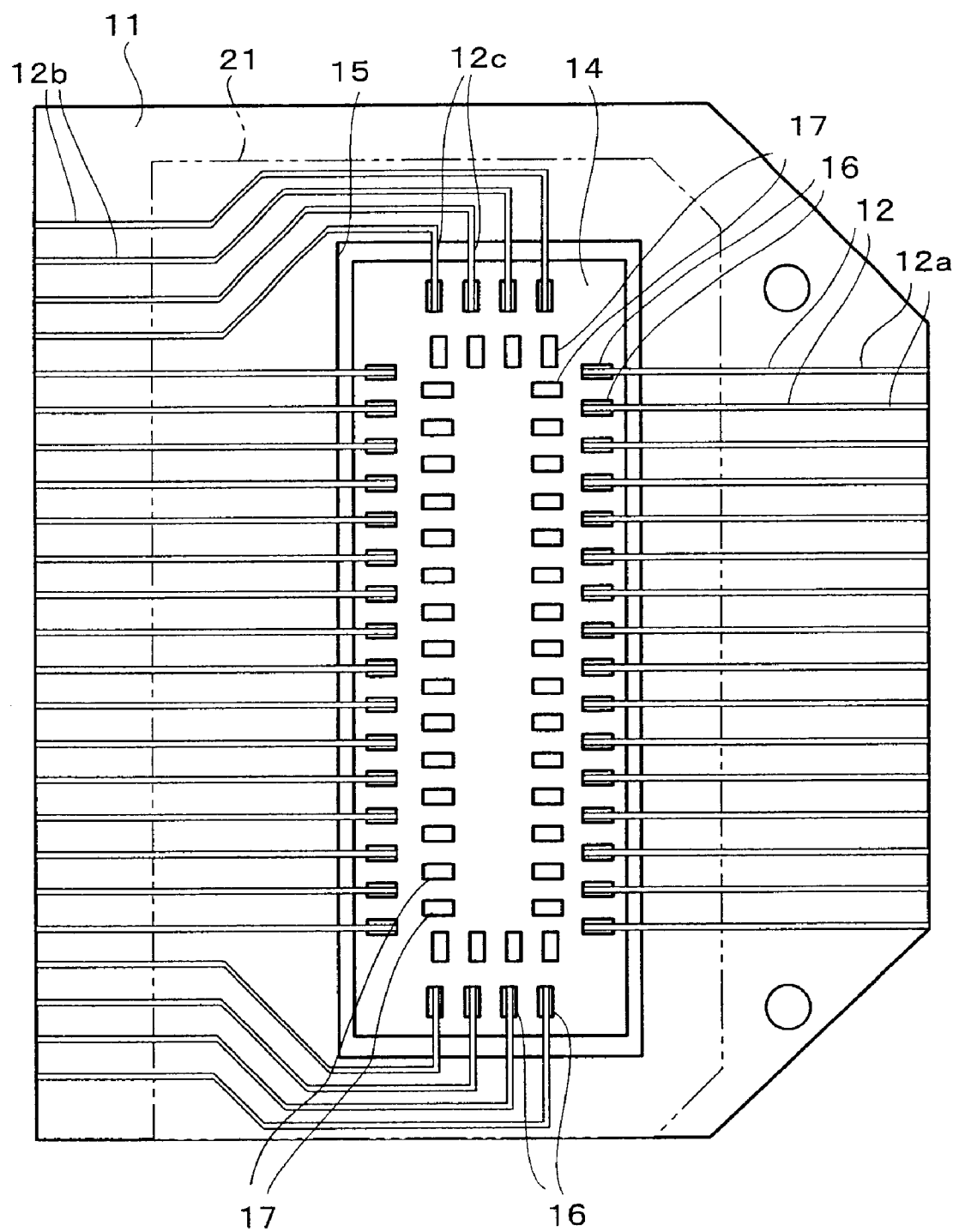
FIG. 2 is a plan view of FIG. 1 showing a manufacturing process of the semiconductor device.
Figure 3:
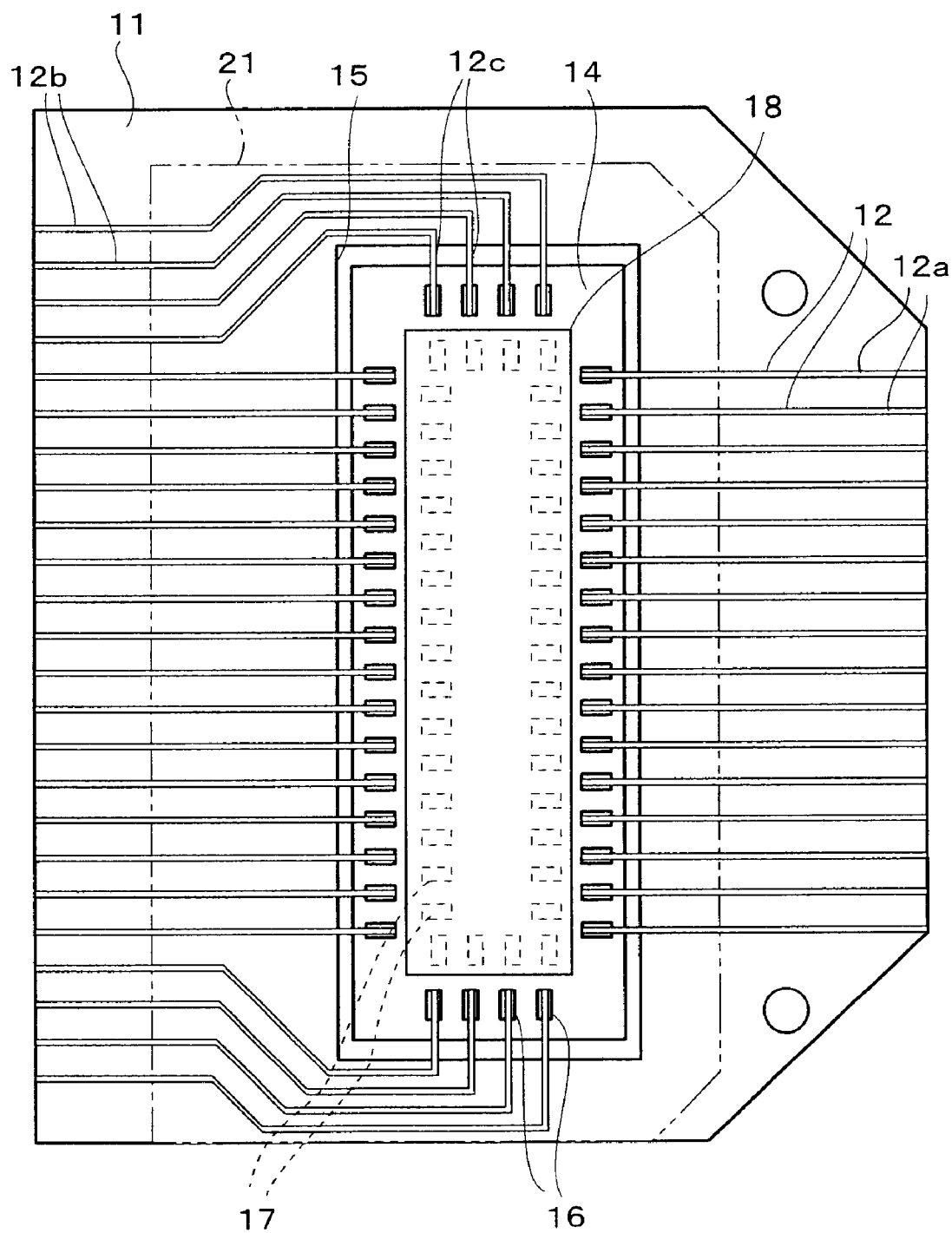
FIG. 3 is a plan view of FIG. 1 showing a manufacturing process of the semiconductor device.
Figure 4:
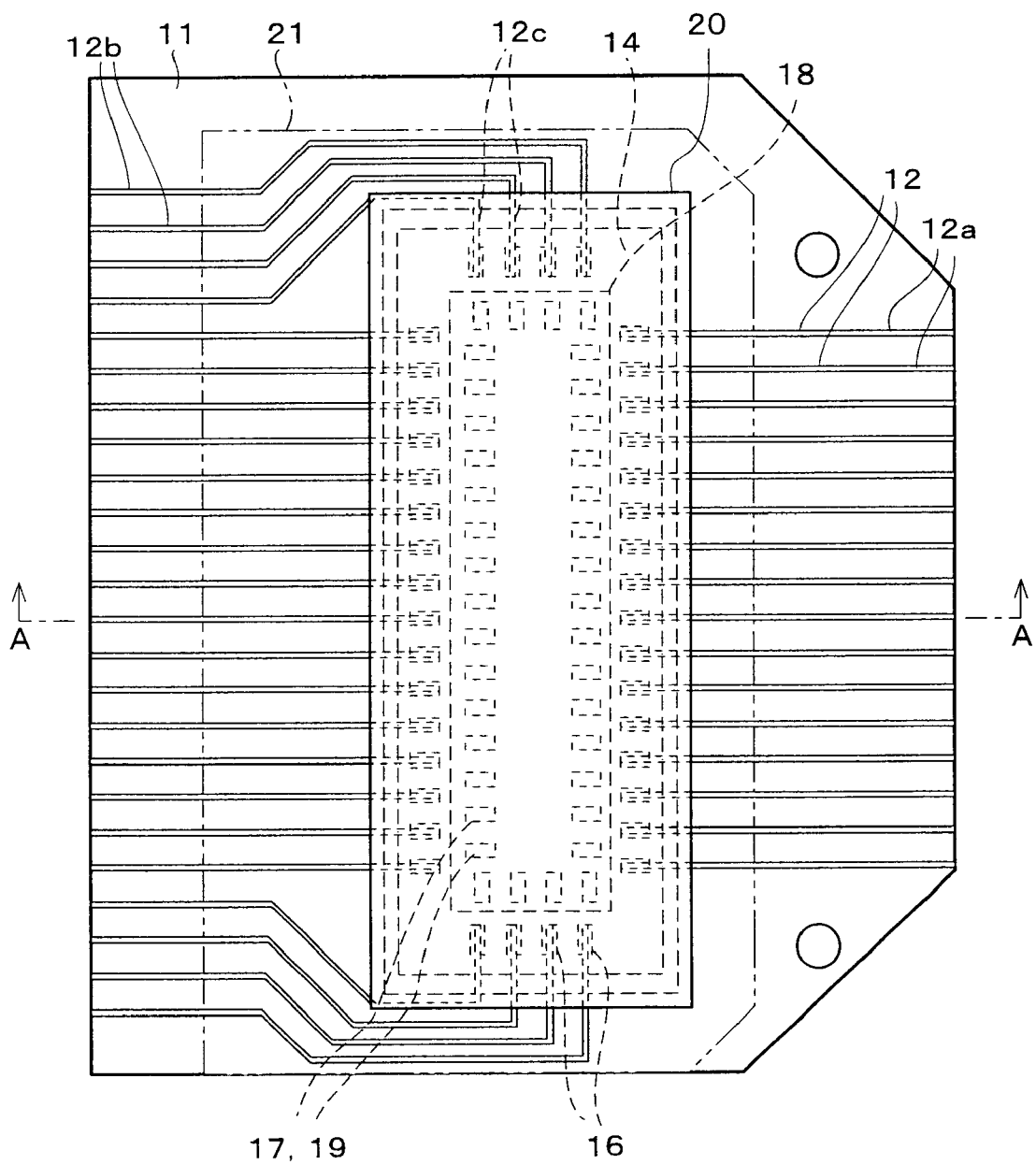
FIG. 4 is a plan view of FIG. 1 showing a manufacturing process of the semiconductor device.

FIG. 1 is a cross-sectional view of a semiconductor device in accordance with a first embodiment of the present invention. FIGS. 2 to 4 are plan views of FIG. 1, and FIG. 4 indicates a cutting plane of FIG. 1 with referential signs A—A.

A tape (tape carrier) 13 is arranged by providing a copper wiring pattern 12 on a base 11 made of organic materials such as polyimide. Extending parts 12a and 12b of the copper wiring pattern 12 extend from the periphery of the base 11 so as to be in parallel with each other. The extending part 12a is connected to, for instance, a pad of a liquid crystal panel via an anisotropic conductive film etc., whereas the extending part 12b is connected to, for instance, a power source and a pad of a printed board to which an image data signal is transmitted. The parts are electrically and mechanically connected. A liquid crystal module contains a liquid crystal panel, a printed board, and a semiconductor device connecting the two.

The connection of the semiconductor device on the liquid crystal panel is done, for instance, by compress-bonding an ACF (Anisotropic Conductive Film) on a connecting part of the liquid crystal panel and then connecting the semiconductor device thereon using a panel mounting machine. Conditions of the connection are, for instance, at a temperature of 200° C., for 2 seconds, and under a pressure of 3 MPa.

A device hole 15 is formed through the base 11 corresponding with a semiconductor chip 14 mounted by ILB. The copper wiring pattern 12 juts into the device hole 15 to form inner leads 12c. The inner lead 12c and the extending parts 12a and 12b of the copper wiring pattern 12 are plated with tin (not illustrated). So as to be connected with gold bumps 16 provided on all four sides of the rectangle semiconductor chip 14, the inner leads 12c juts into the device hole 15 from the four directions, as FIG. 2 shows.

In the semiconductor chip 14 manufactured by dicing a wafer, i.e., eutectic, the gold bump 16 thereof is bonded with tin which electroless-plates the inner lead 12c so that the semiconductor chip 14 is mounted by ILB. The thickness of the tin plating is, for instance, around 0.5 μm. The tin plating is alloyed into the copper of the inner lead 12c to form an alloy layer so that a pure tin layer thereof is around 0.15 μm. The inner lead 12c may be plated with gold.

It is significant that in the present invention, the gold bumps 16 for the ILB are formed along the edge of the semiconductor chip 14 while gold bumps 17 are formed inside the row of the gold bumps 16, and a semiconductor chip 18 is further mounted on the semiconductor chip 14, as shown in FIGS. 1 and 3.

An element surface of the mounted semiconductor chip 14 and surroundings of the inner lead 12c are, as shown in FIG. 4, sealed by potting a resin 20, so that the mechanical strength of the device is retained and the same is protected from the environment. Incidentally, other parts of the tape 13 other than the electrode parts, such as the inner lead 12c, are protected with a coating with a solder resist 21. These processes noted above are successively done on the tape 13 so that the mounting operation is efficiently done.

The semiconductor chip 14 is a liquid crystal driver IC that drives common and segment electrodes of the liquid crystal panel. The semiconductor chip 14 is arranged to have a 0.6 to 0.65 μm width wire, and a terminal pitch thereof is reduced to 50 μm due to gold bumps 17 and 19 even if the chip 14 is sized 17×1.6 mm. The semiconductor chip 14 also includes 96 output terminals on the common side and 308 output terminals on the segment side. The gold bumps 16 and 17 are formed, for instance, to measure 85×40 m. The semiconductor chip 18 is an SRAM having a 0.35 to 0.355 μm width wire, and sized 14×1.0 mm.

The gold bumps 17 and 19 are formed to have a height of 10 μm in average, and it is sufficient if at least one of them is formed. The backs of the semiconductor chips 14 and 18 are grounded to reduce the thickness thereof to 400 μm. In this fashion, the total thickness of the semiconductor device is not more than 1.1 mm, so as to be substantially equal to that of a TCP semiconductor device with one chip. The grinding of the backs, which is not always necessary, is done to make the chips thinner, and the thickness of the chips are preferably not less than 50 μm considering the possibility of breakage of the chips and the handling thereof.

The gold bump 16 of the semiconductor chip 14 is connected to the inner lead 12c using an inner lead bonder. The gold bump 17 of the semiconductor chips 14 and the gold bump 19 of the semiconductor chip 18 are connected using a flip chip bonder, and the bonding condition thereof is, for instance, at a temperature of 500° C., for 2 seconds and under a pressure of 20 to 30 gf in each of the gold bumps 17 and 19.

After the bonding, the gap between the semiconductor chips 14 and 18 is only around 20 μm, and an underfill resin is inserted therein. Then a liquid resin, for instance an amount of 30 mg, is potted, and in a cure furnace, for instance, the semiconductor device is precured for around 20 minutes at a temperature of 125° C. and further post-cured for around three hours at the same temperature. When only one of the gold bumps 17 or 19 is formed as described above, the gap has only a 10 μm width and the viscosity of the underfill resin is as low as around 2 Pa.S.

This arrangement enables the gold bump 17 to be formed simultaneously with the forming of the gold bump 16 necessary for the ILB. At the same time the terminal pitch is reduced as described above, since the relatively hard gold bumps 17 and 19 are less deformed than soft solder bumps, when two semiconductor chips 14 and 18 of the semiconductor device using the TCP structure are stacked.

In the arrangement noted above, the semiconductor chip 18 is made to fit in a dent formed in the device hole 15. This dent is formed by pushing the inner lead 12a into the device hole 15 when the semiconductor chip 14 is connected to the inner lead 12c using the inner lead bonder. This arrangement can make the thickness of the whole semiconductor device thinner than a device in which the semiconductor chips 14 and 18 are simply stacked.

In the arrangement noted above, the semiconductor chip 14 is a liquid crystal driver IC, and the semiconductor chip 18 is an SRAM (Static RAM) which is preferable to be provided in proximity to the liquid crystal driver IC due to its low power consumption, despite that the number of required components is greater than the number in the case of using DRAM (Dynamic RAM) etc. So even if two chips are used, the chips can be provided as thick as one chip by stacking them as above, and each of the chips can be manufactured in the most suitable process.

Figure 5:
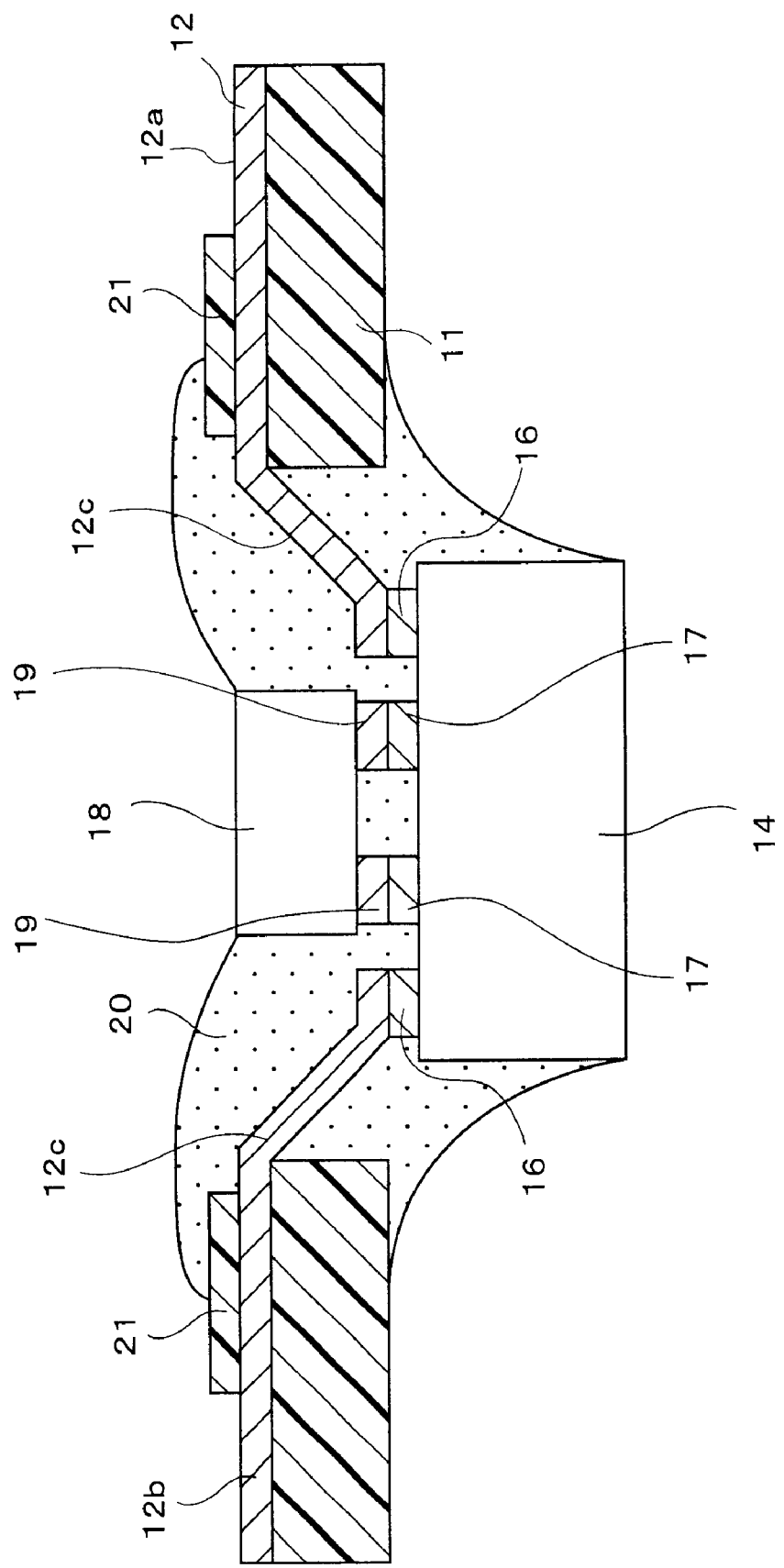
FIG. 5 is a cross-sectional view showing another arrangement of FIG. 1.
Figure 6:
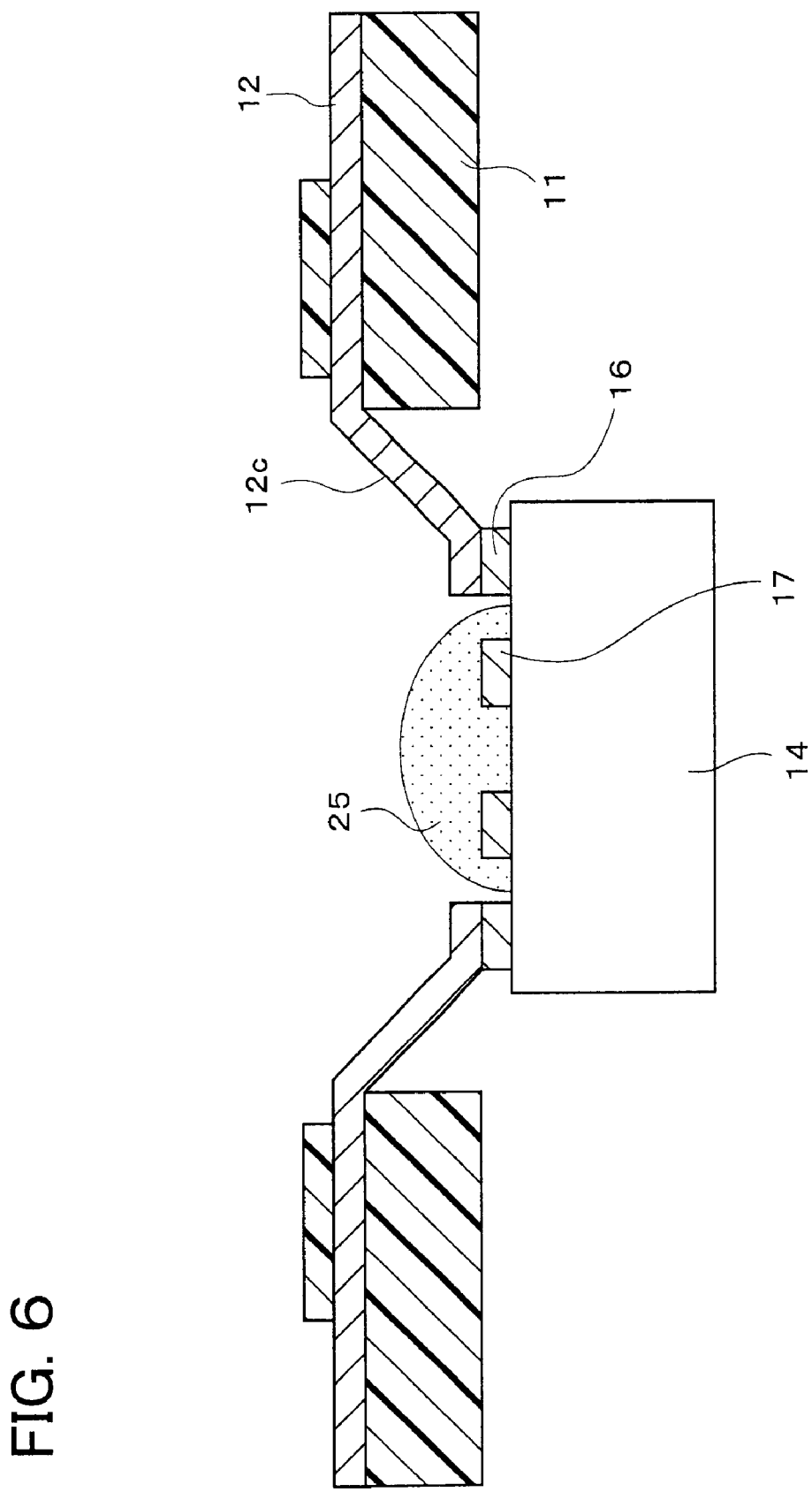
FIG. 6 is a cross-sectional view showing a further arrangement of FIG. 1.

Incidentally, although the whole semiconductor chip 18 is coated with the resin 20 in the example shown in FIG. 1, as shown in FIG. 5, it is possible to coat only the element surface thereof as in the semiconductor chip 14, to make the semiconductor device further thinner.

Figure 7:
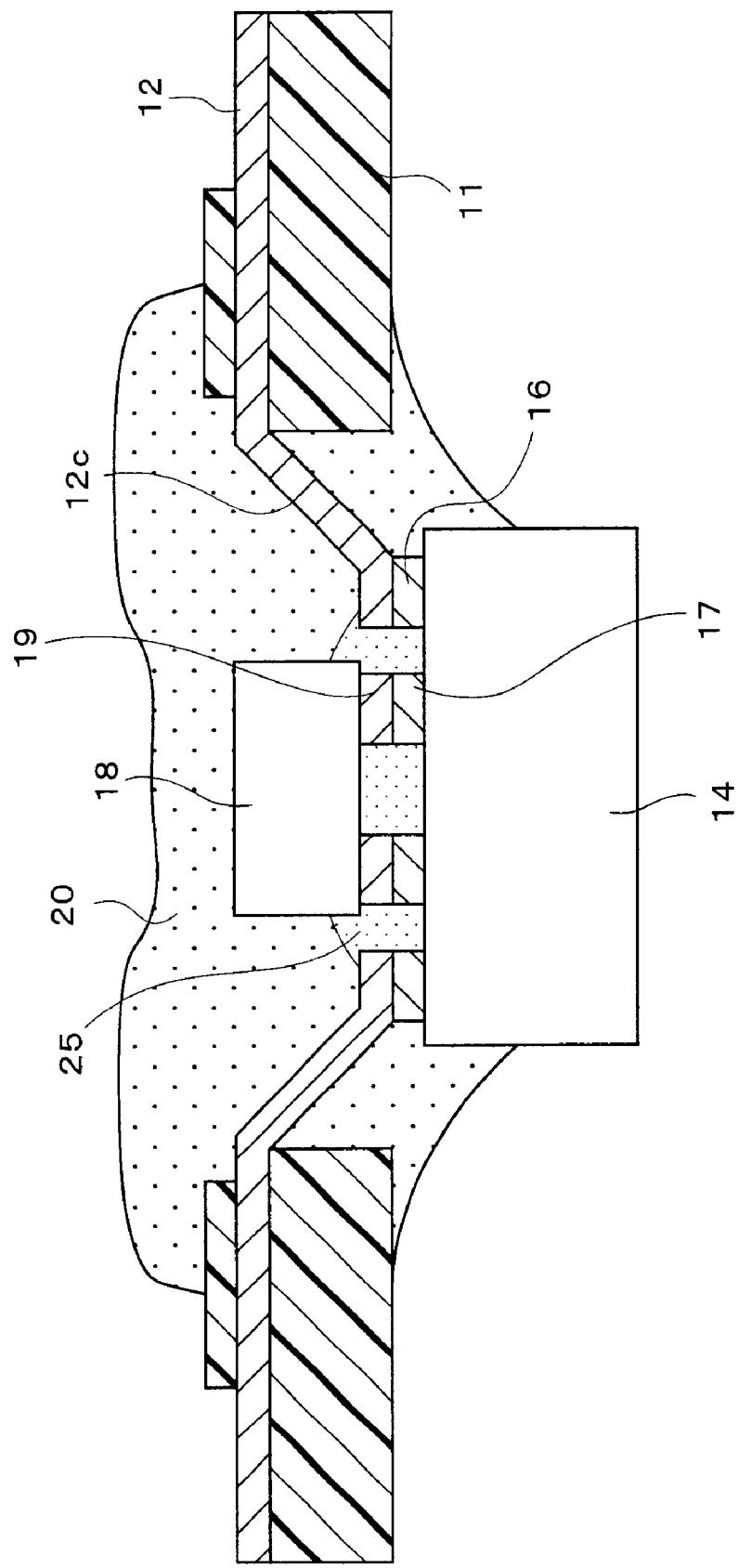
FIG. 7 is a cross-sectional view showing yet another arrangement of FIG. 1.

Also, instead of using the underfill resin, it is possible to pot an NCP (Non Conductive Paste) 25 in an area of the semiconductor chip 14 on which the semiconductor chip 18 is mounted, and then connect the semiconductor 14 to the semiconductor chip 18 using the flip chip bonder, as shown in FIG. 7. In this example, the bonding condition is, for instance, at a temperature of 200° C. and for 2 seconds. The resin 20 made of, for instance, an epoxyresin is potted from the side of the semiconductor 18 so as to cover thereof, then the resin is pre-cured for around 20 minutes at a temperature of 125° C. and further post-cured for three hours at the same temperature.

Figure 8:
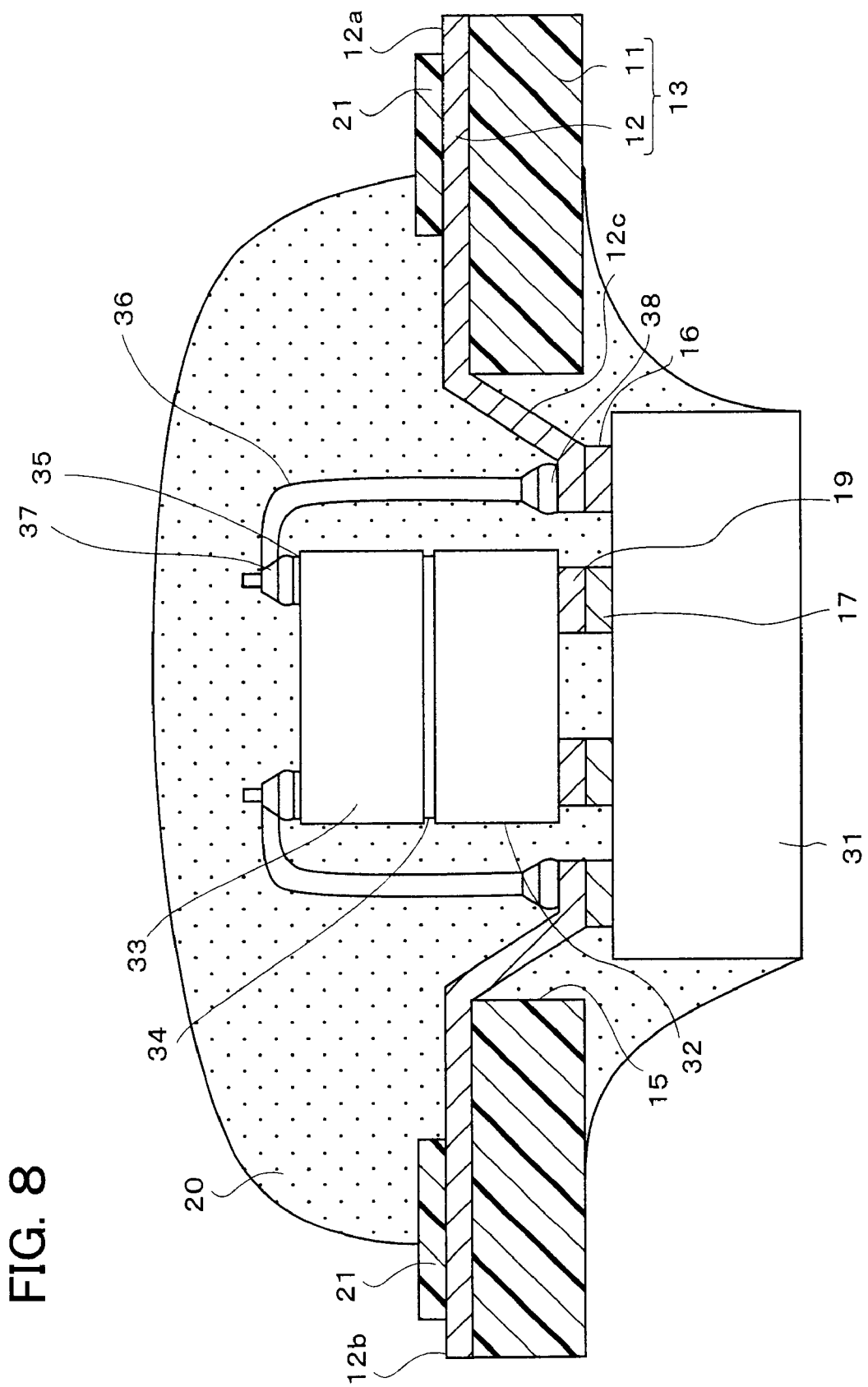
FIG. 8 is a cross-sectional view of a semiconductor device in accordance with a second embodiment of the present invention.
Figure 9:
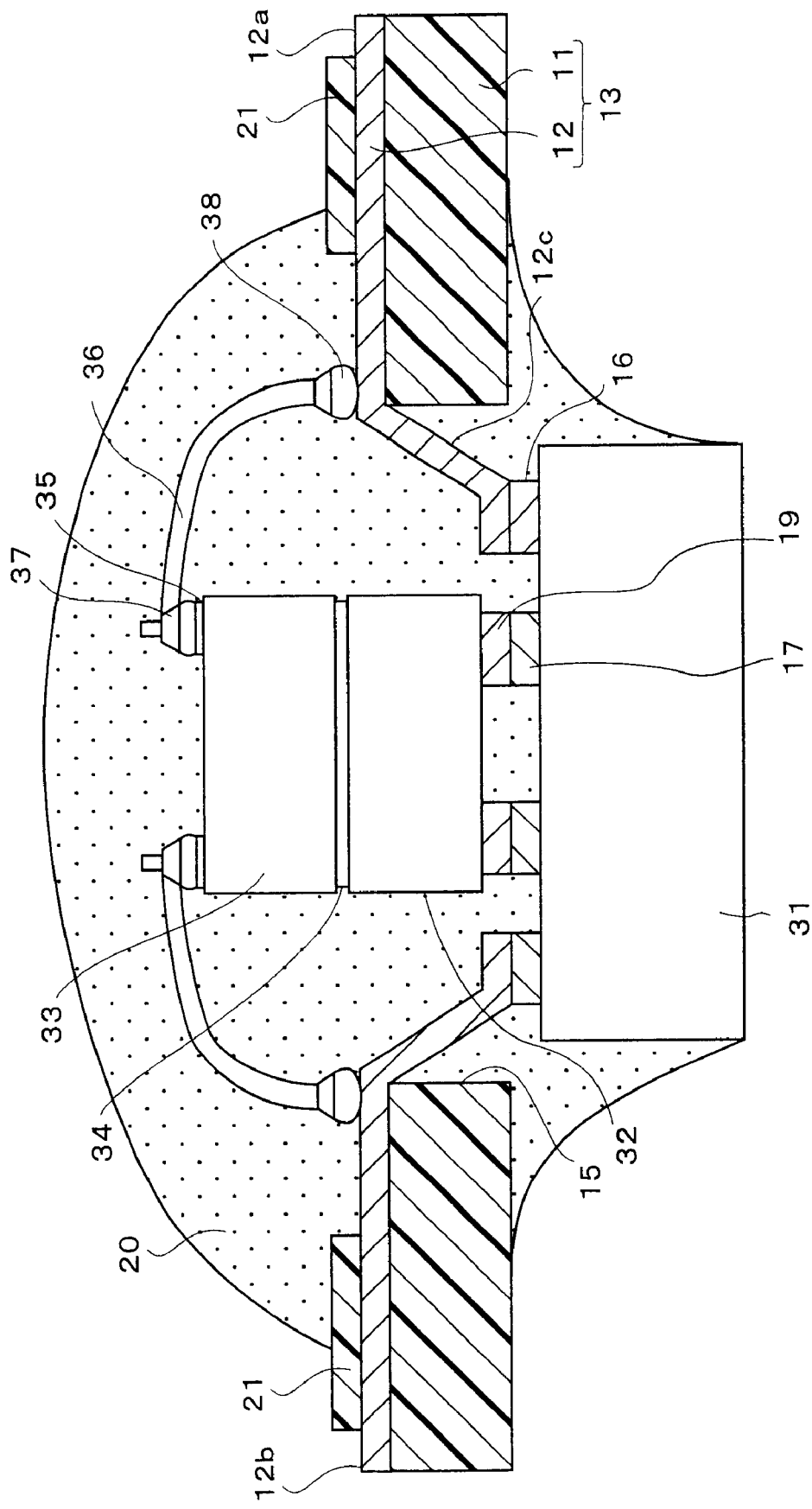
FIG. 9 is a cross-sectional view of a semiconductor device in accordance with the second embodiment of the present invention.

The following description will describe a second embodiment in accordance with the present invention with reference to FIGS. 8 and 9.

FIGS. 8 and 9 are cross-sectional view showing semiconductor devices of the second embodiment of the present invention. These semiconductor devices are similar to the aforementioned device so that elements equivalent to the aforementioned ones have the same signs and the definitions are omitted.

It is noted that in the semiconductor device shown in FIGS. 8 and 9, a semiconductor chip 31 mounted on a tape 13 by ILB is a liquid crystal driver IC for driving a segment electrode of a liquid crystal panel, and a semiconductor chip 32, which is a liquid crystal driver IC for driving a common electrode, is bonded on the semiconductor chip 31, and further a semiconductor chip 33, which is an SRAM, is bonded on the semiconductor chip 32.

In this example, as in the case above, a gold bump 16 of the semiconductor chip 31 is connected to an inner lead 12c by inner lead bonding, and then gold bumps 17 and 19 of the semiconductor chips 31 and 32 are connected to each other by flip chip bonding. Then the semiconductor chip 33 is pasted to the back surface of the semiconductor chip 32, since a dicing sheet 34 used when dicing, adhered to the back surface of the semiconductor chip 33 in advance, acts as an adhesive. Then, via a gold wire 36, an unprotected aluminum pad 35 of the semiconductor chip 33 is bonded either to the inner lead 12c as shown in FIG. 8 or to a copper wiring pattern 12 as shown in FIG. 9.

When the gold wire 36 is bonded to the inner lead 12c, as shown in FIG. 8, a gold ball 37 having a diameter around 100 μm is connected to the aluminum pad 35 in advance, using a bonding tool used for the gold wire 36. The gold wire 36 has a diameter of, for instance, 20 μm to 25 μm, and the wire 36 is bonded with the gold ball 37 after the gold ball 38 is bonded with the inner lead 12c. This can prevent a leakage etc. due to the gold wire 36 coming into contact with the edge of the semiconductor chip 33. The semiconductor chip 32 is formed to be narrower than the semiconductor chip 31. In this example, it is possible to reduce interference between the bonding tool and the semiconductor chip 32 when the chip 32 is bonded to the inner lead 12c as described above.

In the meantime, as shown in FIG. 9, initially the gold ball 37 is formed on the aluminum pad 35 and then the gold wire 36 is bonded to the copper wiring pattern 12. In this fashion, the copper wiring pattern 12 becomes thicker than the pattern 12 before the bonding operation by an amount of around 110 μm because of the looped gold wire 36.

The semiconductor chip 33 can be wire-bonded even if the same is bigger than the semiconductor chip 32. This arrangement makes it possible to mount the semiconductor chips 31 to 33 having mutually different functions, without changing an amount of area required for mounting, so as to improve the yields of the semiconductor chips.

Figure 10:
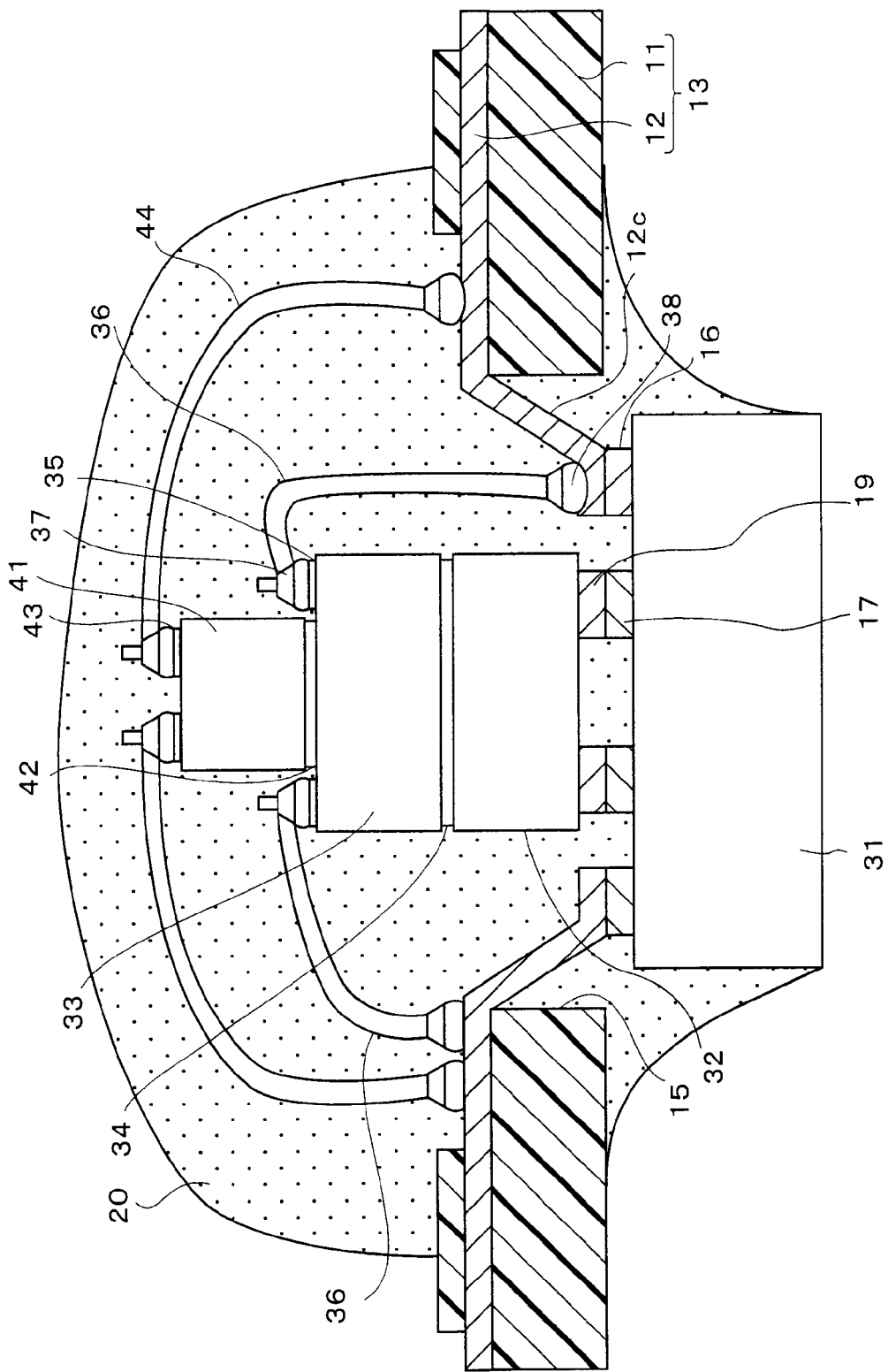
FIG. 10 is a cross-sectional view of a semiconductor device in accordance with a third embodiment of the present invention.
Figure 11:
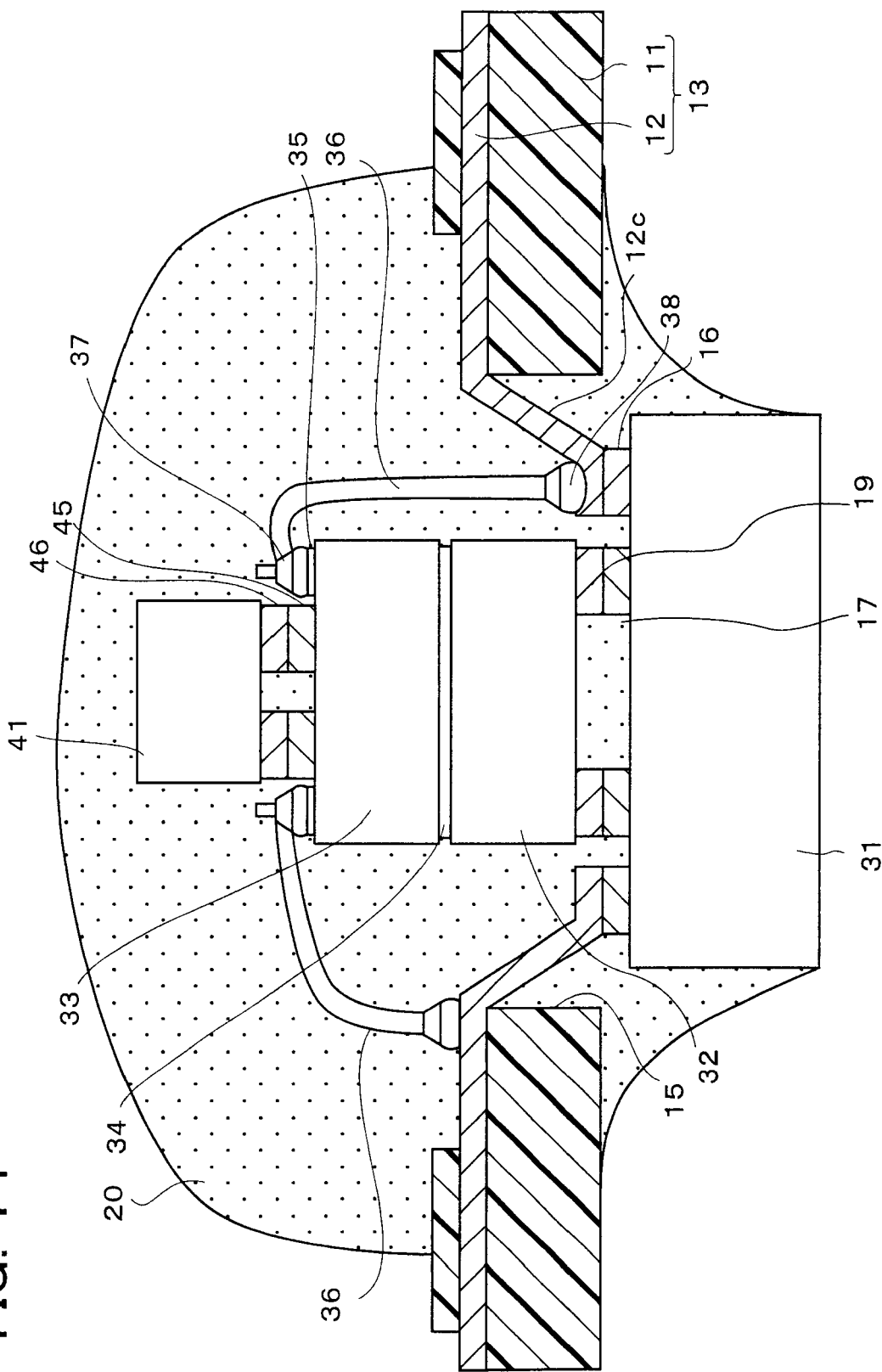
FIG. 11 is a cross-sectional view of a semiconductor device in accordance with the third embodiment of the present invention.
Figure 12:
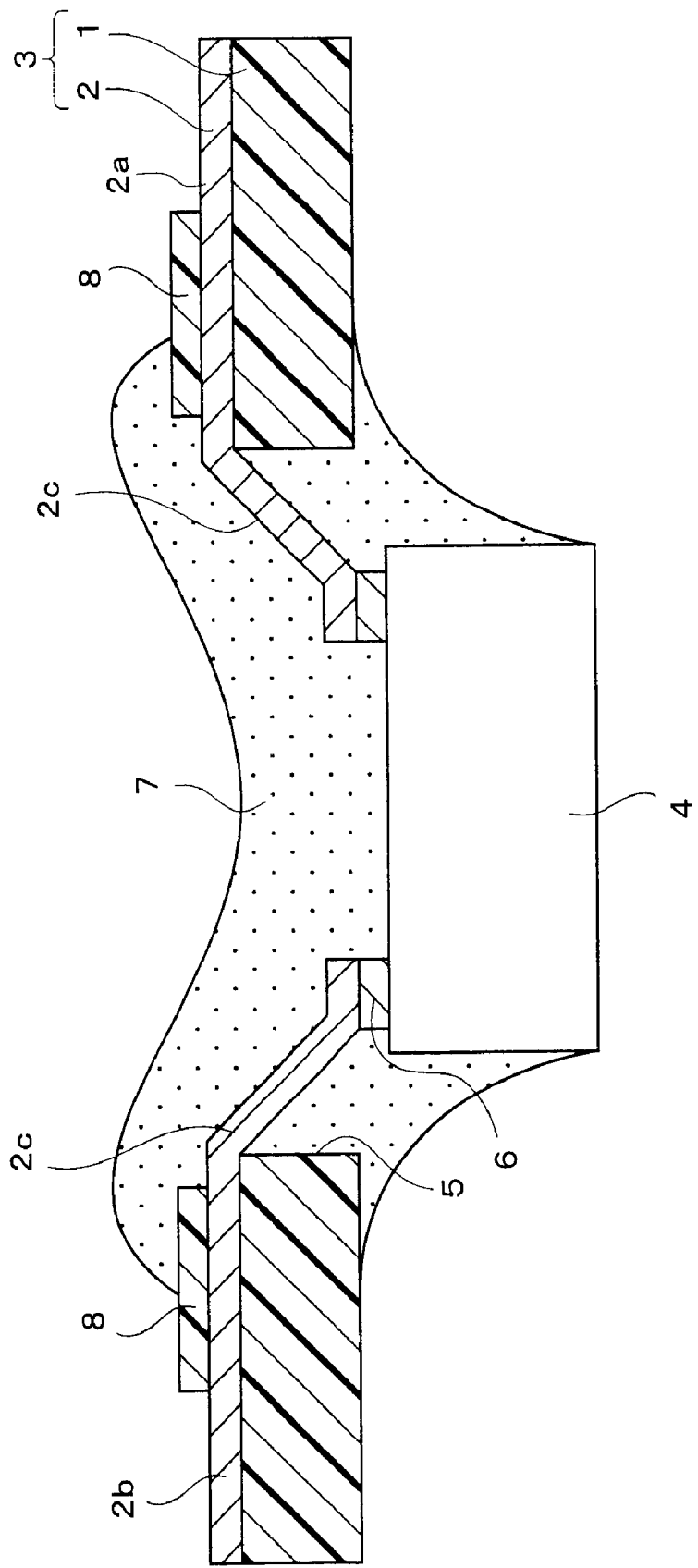
FIG. 12 is a cross-sectional view describing a typical semiconductor device using TCP, which has been conventionally known.

The following description will describe a third embodiment in accordance with the present invention with reference to FIGS. 10 and 11.

FIGS. 10 and 11 are cross-sectional views showing semiconductor devices of the third embodiment of the present invention. These semiconductor devices are similar to the device shown in FIGS. 8 and 9 so that elements equivalent to the aforementioned ones have the same sign and the definitions are omitted.

It is noted that in the semiconductor device shown in FIGS. 10 and 11, a semiconductor chip 41, which is a controller IC, is further bonded on a semiconductor chip 33.

Similarly to the semiconductor chip 33, by a dicing sheet 42, the back surface of the semiconductor chip 41 is, as shown in FIG. 10, bonded to an area on the semiconductor chip 33, which is surrounded by aluminum pads 35. The aluminum pad 43 is bonded with an inner lead 12c via a gold wire 44.

In the arrangement shown in FIG. 11, meanwhile, similarly to the semiconductor chip 32, the element surface of the semiconductor chip 41 faces the equivalent of the semiconductor chip 33, and gold bumps 45 and 46 of these two chips are connected by flip chip bonding. In this manner, the number of layered semiconductor devices can be further increased.

As described above, a semiconductor device of the present invention includes:
- a tape carrier including: a wiring pattern formed on an organic base having an opening portion; and the wiring pattern including an inner lead portion jutting into the opening portion;
- a semiconductor chip (semiconductor chip 14) mounted in the opening portion of the tape carrier, a first electrode formed on a surface of the semiconductor chip, the first electrode connected to the inner lead via a first gold bump; and
- a first electronic component (semiconductor chip 18), mounted on the tape carrier by stacking onto the semiconductor chip, and the semiconductor chip including a second electrode formed on the same surface as the first electrode, the second electrode connected via a second gold bump to a third electrode formed on a first surface of the first electronic component; and
- second electronic component having a first surface connected to the first electronic component by stacking onto a second surface of the first electronic component. In this example, the arrangement can meet the requirement to produce a finer liquid crystal panel.

The semiconductor device of the present invention is preferably arranged so that another electronic component is stacked on the electronic component with back surfaces thereof facing each other, and an electrode of the upper electronic component is connected to the inner lead or the wiring pattern on the tape carrier by wire-bonding.

In this case, the electrode of the upper electronic component is connected to the inner lead or the wiring pattern on the tape carrier by wire-bonding, to stack one or more electronic components on the two stacked electronic components. On this account, not less than three chips can be mounted.

Moreover, the semiconductor device of the present invention is preferably arranged so that the electronic component is narrower than the semiconductor chip.

In this example, it is possible to reduce interference between a bonding tool and the electronic component when not less than three chips are stacked and the electrode of the upper electronic component is connected to the inner lead by wire-bonding.

Furthermore, the semiconductor device of the present invention is preferably arranged so that the semiconductor chip is a liquid crystal driver IC and the electronic component is an SRAM.

On this account, the semiconductor device includes two chips, i.e. the liquid crystal driver IC and the SRAM (Static RAM) which is preferable to be provided in proximity to the liquid crystal driver IC due to its low power consumption, despite that the number of required components is greater than the number in the case of using DRAM (Dynamic RAM) etc., and each of the chips can be manufactured in the most suitable process.

Moreover, the semiconductor device of the present invention is preferably connected to a liquid crystal panel so as to constitute a liquid crystal module.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A semiconductor device, comprising:
    a tape carrier including:
        a wiring pattern formed on an organic base having an opening portion; and the wiring pattern including an inner lead portion jutting into the opening portion;
    a semiconductor chip mounted in the opening portion of the tape carrier and a first electrode formed on a surface of the semiconductor chip, the first electrode connected to the inner lead via a first gold bump; and
    an electronic component, mounted on the tape carrier by stacking onto the semiconductor chip, the semiconductor chip including a second electrode formed on the same surface as the first electrode, the second electrode connected via a second gold bump to a third electrode formed on a first surface of the electronic component.

2. The semiconductor device as set forth in claim 1, wherein the electronic component is narrower than the semiconductor chip.

3. The semiconductor device as set forth in claim 1, wherein the inner lead is plated with tin or gold.

4. The semiconductor device as set forth in claim 1, wherein the second gold bump, which connects the second electrode of the semiconductor chip to the third electrode of the electronic component, is formed on either the second electrode or the third electrode of the electronic component.

5. The semiconductor device as set forth in claim 1, further comprising a resin for sealing the semiconductor chip and the electronic component, wherein the resin is not provided on a second surface of the electronic component, which second surface is opposite to the first surface of the electronic component having the third electrode.

6. The semiconductor device as set forth in claim 1, wherein the semiconductor chip is a liquid crystal driver IC, and the electronic component is an SRAM.

7. A liquid crystal module comprising the semiconductor device as set forth in claim 6, wherein the semiconductor device is connected to a liquid crystal panel.

8. A semiconductor device, comprising:
    a tape carrier including;
    a wiring pattern formed on an organic base having an opening portion; and the wiring pattern including an inner lead portion jutting into the opening portion;
    a semiconductor chip mounted in the opening portion of the tape carrier, a first electrode formed on a surface of the semiconductor chip, the first electrode connected to the inner lead via a first gold bump;
    a first electronic component, mounted on the tape carrier by stacking onto the semiconductor chip, the semiconductor chip including a second electrode formed on the same surface as the first electrode, the second electrode connected to a third electrode formed on a first surface of the first electronic component; and a second electronic component having a first surface connected to the first electronic component by stacking onto a second surface of the first electronic component, and mounted on the tape carrier by wire-bonding.

9. The semiconductor device as set forth in claim 8, wherein a fourth electrode is formed on a second surface of the second electronic component for providing a connection to the inner lead by wire-bonding.

10. The semiconductor device as set forth in claim 8, wherein a fourth electrode of the second electronic component is connected to the wiring pattern by wire-bonding.

11. The semiconductor device as set forth in claim 8, wherein the first and the second electronic components are narrower than the semiconductor chip.

12. The semiconductor device as set forth in claim 8, wherein a third electronic component is further stacked on the second electronic component.

13. A semiconductor device in which:

a semiconductor chip is mounted on a tape carrier including a wiring pattern formed on an organic substrate having an opening in which the semiconductor chip is inserted, by connecting the semiconductor chip to an inner lead that is a part of the wiring pattern jutting into the opening;

a first electrode formed by a first gold bump is connected to the inner lead and a second electrode formed by a second gold bump are formed on a surface of the semiconductor chip facing the inner lead; and an electronic component is mounted on the tape carrier by stacking onto the semiconductor chip thereby connecting the second electrode to a third electrode of the electronic component, the third electrode being made of a gold bump.

* * * * *